US010539881B1

(12) United States Patent
Sha et al.

(10) Patent No.: US 10,539,881 B1
(45) Date of Patent: Jan. 21, 2020

(54) GENERATION OF HOTSPOT-CONTAINING PHYSICAL DESIGN LAYOUT PATTERNS

(71) Applicant: International Business Machines Corporation, Armonk, NY (US)

(72) Inventors: Jing Sha, White Plains, NY (US); Dongbing Shao, Wappingers Falls, NY (US); Martin Burkhardt, White Plains, NY (US); Sean Burns, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/139,986

(22) Filed: Sep. 24, 2018

(51) Int. Cl.
G06F 17/50 (2006.01)
G03F 7/20 (2006.01)

(52) U.S. Cl.
CPC ...... *G03F 7/70433* (2013.01); *G06F 17/5081* (2013.01)

(58) Field of Classification Search
CPC .... G03F 1/70; G03F 7/70433; G06F 17/5068; G06F 17/5081
USPC .................................................. 716/52, 111
See application file for complete search history.

(56) References Cited

U.S. PATENT DOCUMENTS

| 8,402,397 B2 | 3/2013 | Robles et al. |
| 8,601,419 B1 | 12/2013 | Chiang et al. |
| 8,732,629 B2 | 5/2014 | Tong |
| 2014/0358830 A1 | 12/2014 | Chiang et al. |
| 2016/0125120 A1* | 5/2016 | Yu ........................ G06F 17/5081 716/52 |
| 2019/0147134 A1* | 5/2019 | Wang .................. G06F 17/5081 716/52 |

OTHER PUBLICATIONS

Arthur Balasinski, "DfM at 28 nm and Beyond," Design for Manufacturability, Chapter 3, Aug. 11, 2014, pp. 103-203.

(Continued)

*Primary Examiner* — Paul Dinh
(74) *Attorney, Agent, or Firm* — Vazken Alexanian; Ryan, Mason & Lewis, LLP

(57) ABSTRACT

A method for generating physical design layout patterns includes selecting as training data a set of physical design layout patterns of patterned structures. The method also includes training, utilizing physical design layout patterns containing hotspots, a first neural network model configured to generate synthetic physical design layout patterns, and training, utilizing physical design layout patterns that do and do not contain hotspots, a second neural network model configured to classify whether physical design layout patterns contain hotspots. The method further includes generating synthetic physical design layout patterns containing hotspots by utilizing the trained first neural network model to generate synthetic physical design layout patterns and utilizing the trained second neural network model to select the synthetic physical design layout patterns containing hotspots. The method further includes evaluating manufacturability of a given patterned structure comprising at least one of the synthetic physical design layout patterns containing at least one hotspot.

20 Claims, 10 Drawing Sheets

(56) References Cited

OTHER PUBLICATIONS

Y.-T. Yu et al., "Accurate Process-Hotspot Detection Using Critical Design Rule Extraction," Proceedings of the 49th Annual Design Automation Conference (DAC), Jun. 3-7, 2012, pp. 1167-1172.
D. Ding et al., "Machine Learning Based Lithographic Hotspot Detection with Critical-Feature Extraction and Classification," International Conference on IC Design and Technology, May 18-20, 2009, pp. 219-222.
A.B. Kahng et al., "Fast Dual Graph-Based Hotspot Detection," Proceedings of SPIE, Photomask Technology, Oct. 20, 2006, 9 pages, vol. 6349.
Y.-T. Yu et al., "Machine-Learning-Based Hotspot Detection Using Topological Classification and Critical Feature Extraction," Proceedings of the 50th ACM/EDAC/IEEE Design Automation Conference (DAC), May 29-Jun. 7, 2013, 6 pages, Article No. 67.
J.-Y. Wuu et al., "Efficient Approach to Early Detection of Lithographic Hotspots Using Machine Learning Systems and Pattern Matching," Proceedings of SPIE, Design for Manufacturability Through Design-Process Integration V, Apr. 4, 2011, 9 pages, vol. 7974.
A. Hamouda et al., "Enhanced OPC Recipe Coverage and Early Hotspot Detection Through Automated Layout Generation and Analysis," Proceedings of SPIE, Optical Microlithography XXX, Mar. 24, 2017, 9 pages, vol. 10147.
J.-W. Jeon et al., "Early Stage Hot Spot Analysis Through Standard Cell Base Random Pattern Generation," Proceedings of SPIE, Design-Process-Technology Co-optimization for Manufacturability XI, Apr. 4, 2017, 7 pages, vol. 10148.
H. Yang et al., "Layout Hotspot Detection with Feature Tensor Generation and Deep Biased Learning," Proceedings of the 54th Annual Design Automation Conference (DAC), Jun. 18-22, 2017, 6 pages, Article No. 62.
M. Shin et al., "CNN Based Lithography Hotspot Detection," International Journal of Fuzzy Logic and Intelligent Systems (IJFLIS), Sep. 25, 2016, pp. 208-215, vol. 16, No. 3.
H. Yang et al., "Imbalance Aware Lithography Hotspot Detection: A Deep Learning Approach," Proceedings of SPIE, Design-Process-Technology Co-optimization for Manufacturability XI, Journal of Micro/Nanolithography, MEMS, and MOEMS, Mar. 28, 2017, 14 pages, vol. 16, No. 3.
T. Matsunawa et al., "Automatic Layout Feature Extraction for Lithography Hotspot Detection Based on Deep Neural Network," Proceedings of SPIE, Design-Process-Technology Co-optimization for Manufacturability X, Mar. 16, 2016, 11 pages, vol. 9781.

\* cited by examiner

GENERATION OF HOTSPOT-CONTAINING PHYSICAL DESIGN LAYOUT PATTERNS

BACKGROUND

The present application relates to semiconductor manufacturing, and more specifically, to techniques for patterning in semiconductor manufacturing. Patterned structures may include single layer and multi-layer structures. Each layer of a patterned structure may include a number of vias, lines and various other features. Generating and expanding layout pattern libraries for these and other features is useful for evaluating manufacturability.

SUMMARY

Embodiments of the invention provide techniques for generating synthetic physical design layout patterns containing hotspots.

In one embodiment, a method for generating physical design layout patterns containing hotspots comprises the step of selecting as training data a set of physical design layout patterns of patterned structures. The method also comprises the step of training, utilizing a first subset of the training data comprising physical design layout patterns containing hotspots, a first neural network model configured to generate synthetic physical design layout patterns. The method further comprises the step of training, utilizing a second subset of the training data comprising at least one physical design layout pattern containing a hotspot and at least one physical design layout pattern not containing a hotspot, a second neural network model configured to classify whether physical design layout patterns contain hotspots. The method further comprises the step of generating one or more synthetic physical design layout patterns containing hotspots, wherein generating the one or more synthetic physical design layout patterns containing hotspots comprises utilizing the trained first neural network model to generate a set of synthetic physical design layout patterns and utilizing the trained second neural network model to select one or more of the set of synthetic physical design layout patterns as the one or more synthetic physical design layout patterns containing hotspots. The method further comprises the step of evaluating manufacturability of a given patterned structure comprising at least one of the generated synthetic physical design layout patterns containing at least one hotspot. The method is performed by at least one processing device comprising a processor coupled to a memory.

In another embodiment, a computer program product comprises a computer readable storage medium having program instructions embodied therewith. The program instructions are executable by at least one computing device to cause the at least one computing device to perform the step of selecting as training data a set of physical design layout patterns of patterned structures. The program instructions are also executable by at least one computing device to cause the at least one computing device to perform the step of training, utilizing a first subset of the training data comprising physical design layout patterns containing hotspots, a first neural network model configured to generate synthetic physical design layout patterns. The program instructions are further executable by at least one computing device to cause the at least one computing device to perform the step of training, utilizing a second subset of the training data comprising at least one physical design layout pattern containing a hotspot and at least one physical design layout pattern not containing a hotspot, a second neural network model configured to classify whether physical design layout patterns contain hotspots. The program instructions are further executable by at least one computing device to cause the at least one computing device to perform the step of generating one or more synthetic physical design layout patterns containing hotspots, wherein generating the one or more synthetic physical design layout patterns containing hotspots comprises utilizing the trained first neural network model to generate a set of synthetic physical design layout patterns and utilizing the trained second neural network model to select one or more of the set of synthetic physical design layout patterns as the one or more synthetic physical design layout patterns containing hotspots. The program instructions are further executable by at least one computing device to cause the at least one computing device to perform the step of evaluating manufacturability of a given patterned structure comprising at least one of the generated synthetic physical design layout patterns containing at least one hotspot.

In another embodiment, an apparatus comprises a memory and at least one processor coupled to the memory and configured for selecting as training data a set of physical design layout patterns of patterned structures. The processor is also configured for training, utilizing a first subset of the training data comprising physical design layout patterns containing hotspots, a first neural network model configured to generate synthetic physical design layout patterns. The processor is further configured for training, utilizing a second subset of the training data comprising at least one physical design layout pattern containing a hotspot and at least one physical design layout pattern not containing a hotspot, a second neural network model configured to classify whether physical design layout patterns contain hotspots. The processor is further configured for generating one or more synthetic physical design layout patterns containing hotspots, wherein generating the one or more synthetic physical design layout patterns containing hotspots comprises utilizing the trained first neural network model to generate a set of synthetic physical design layout patterns and utilizing the trained second neural network model to select one or more of the set of synthetic physical design layout patterns as the one or more synthetic physical design layout patterns containing hotspots. The processor is further configured for evaluating manufacturability of a given patterned structure comprising at least one of the generated synthetic physical design layout patterns containing at least one hotspot.

These and other objects, features and advantages of the present invention will become apparent from the following detailed description of illustrative embodiments thereof, which is to be read in connection with the accompanying drawings.

DETAILED DESCRIPTION

Figure 1:
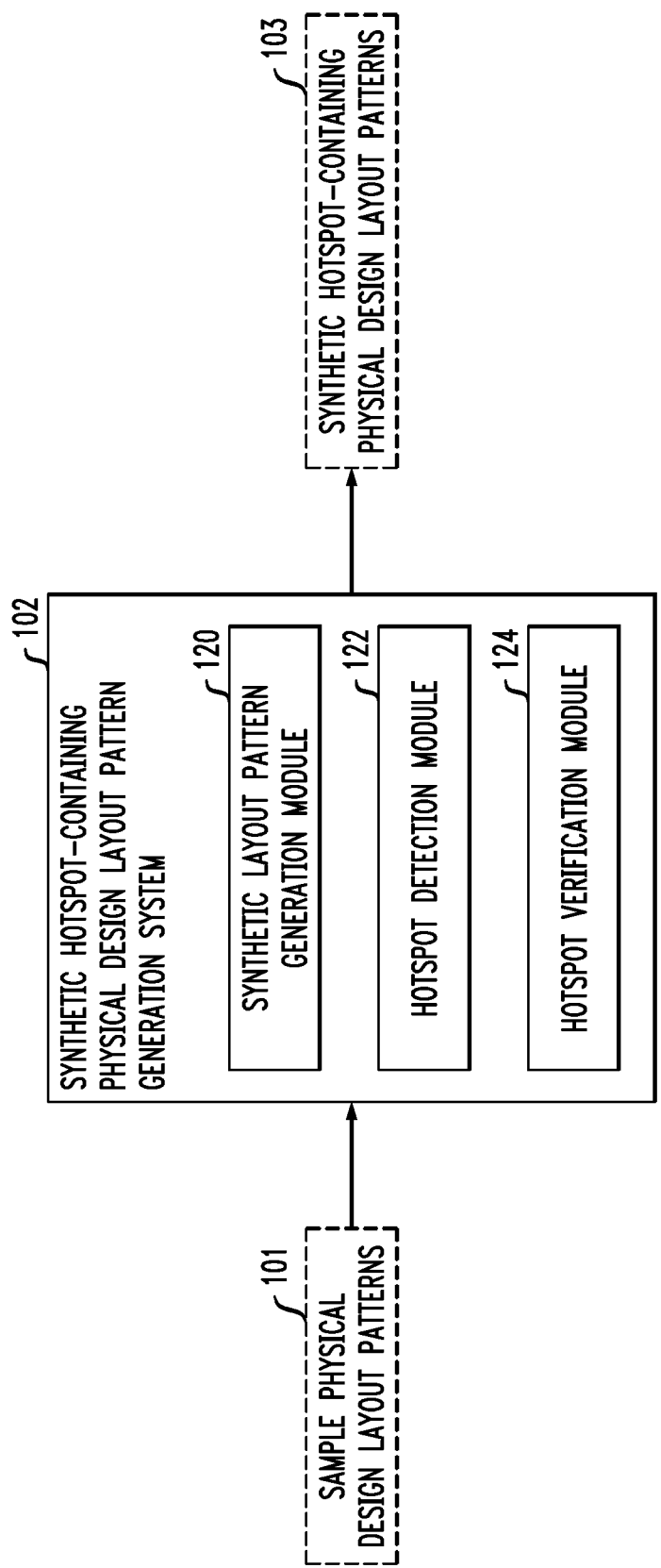
FIG. 1 depicts a system for generating synthetic physical design layout patterns containing hotspots, according to an exemplary embodiment of the present invention.

Illustrative embodiments of the invention may be described herein in the context of illustrative methods, systems and devices for generating synthetic physical design layout patterns containing hotspots. However, it is to be understood that embodiments of the invention are not limited to the illustrative methods, systems and devices but instead are more broadly applicable to other suitable methods, systems and devices.

As discussed above, determining possible layouts for vias, lines and other features of patterned structures is useful for evaluating manufacturability. Patterned structures include structures formed in semiconductor manufacturing, which may include various materials including but not limited to semiconductors, metals, oxides, etc. in one or more layers. Generating synthetic layout patterns, as an example, can be a crucial part of early stage hot spot and failure mode analysis, especially when real layout data is limited. Synthetic layout patterns are also useful for design space exploration. For example, in conducting a manufacturability study, it is generally desired to have as many design layouts as possible. Layout patterns for patterned structures are critical for assessing the manufacturability of a patterned structure.

Various embodiments will be described in detail herein with respect to generating physical design layout patterns which contain hotspots. In some embodiments, it is assumed that the physical design layout patterns are single-layer physical design layout patterns. It should be appreciated however, that embodiments are not limited to use in generating single-layer physical design layout patterns which contain hotspots. In some embodiments, a synthetic layout pattern generation system may be used to generate multi-layer physical design layout patterns containing hotspots.

As component sizes progressively decrease and as the complexity of integrated circuit designs increases, it is becoming more difficult to guarantee that particular circuit designs or layout patterns meet manufacturability requirements. A particular circuit design, for example, may not be manufacturable or may be inoperable in a first iteration, necessitating extensive testing and iterative design revisions. In particular, semiconductor manufacturing processes will often run into "hotspots," which may represent layout patterns or portions thereof that are difficult or impossible to manufacture, or which cause device issues when manufactured. Examples of hotspots include manufacturing errors such as pinching, bridging, missing patterns, etc. that may lead to failure of a fabricated device. A hotspot does not necessarily refer to or identify a specific circuit component, but may instead refer to a region of a physical design layout pattern that is associated with some problem or potential issue in downstream manufacturing or operation.

It should be appreciated that hotspots may take on various forms. A geometry hotspot, for example, may refer to an identified layout feature which has, for example, a width that is less than a minimum defined width threshold, a distance between a pair of layout features that is less than a minimum defined threshold value, etc. An electrical hotspot, as another example, may refer to a device feature that, when printed or fabricated, does not meet one or more prescribed electrical parameters. For example, a transistor having defined geometric specifications (e.g., width, length, etc.), even when printed or fabricated to such geometric specifications, may not meet one or more electrical specifications thus leading to an electrical hotspot. Electrical hotspot detection may be performed on simulated wafer contours, such as with the assistance of contour-to-electrical mapping tools that translate simulated contours into equivalent geometric or rectilinear device parameters (e.g., width, length, etc.).

The generation of synthetic layout patterns and the detection, classification and localization of hotspots in layout patterns are often distinct and cumbersome manual processes. For example, pattern generation is often performed by human designers using manual scripting and polygon maneuvering. Such approaches, however, are limited by the designers' understanding of layouts and are limited in generating large-scale synthetic data. These and other approaches require significant manual effort (e.g., human manipulations), which is error prone and has limited scalability. Another way to generate layout patterns is to use Electronic Design Automation (EDA) tools or other software. Such tools and software, however, are generally limited in that pattern generation is based on predefined building blocks and hardcoded rules to generate reasonable layout patterns.

Existing approaches to hotspot identification, such as process simulation and geometric verification, are each lacking in significant ways. Process simulation may generate simulated layout pattern contours which are then used to check for hotspots. Such simulations are resource-intensive and time-consuming, and do not scale when evaluating larger layouts. Furthermore, the accuracy of the resulting hotspot classification depends on the quality of the simulation, with hotspots potentially being missed if the simulation is lacking.

Geometric verification uses a set of known features associated with hotspots, for example by evaluating geometric similarity of a test layout pattern with registered hotspot patterns. Pattern matching methods in particular are only useful for known hotspot configurations and are inadequate for identifying previously unknown hotspots. Geometric verification further relies on feature engineering.

In addition, both process simulation and geometric verification are generally limited to the detection of intra-layer hotspots that are confined to a single layer of physical design layout. Inter-layer hotspots are even more computationally expensive to detect by process simulation and are nearly impossible to detect by geometric verification.

Illustrative embodiments provide an automated and efficient workflow for generating new synthetic physical design layout patterns which contain hotspots by integrating synthetic layout pattern generation and hotspot detection. In some embodiments, software simulation is not used. The automated workflow in some embodiments iterates through generating synthetic layout patterns and detecting hotspots in the synthetic layout patterns to find as many synthetic layout patterns containing hotspots as possible.

Embodiments can provide a number of advantages relative to conventional techniques. For example, no simulation is needed for hotspot detection and localization. Further, EDA software is not required, thus saving time and cost. In addition, illustrative embodiments provide automated workflows which do not require human intervention after model training. Trained models in some embodiments provide advantages in speed and scalability, as the automated workflow may be constructed of neural networks which are must faster than running simulation or pattern generation in software. Further advantages in speed and scalability are provided as the trained models can generate new physical design layout patterns and detect and localize hotspots quickly (e.g., in seconds depending on available computing resources). Further, some embodiments benefit from cumulative learning, in that models become more versatile and robust with more training data. The automated workflows are further utilizable by various entities, including those that perform EDA and foundries which manufacture patterned structures such as integrated circuits using physical design layout patterns.

FIG. 1 shows a system 102 for generating synthetic hotspot-containing physical design layout patterns. The system 102 includes a synthetic layout pattern generation module 120, a hotspot detection module 122, and a hotspot verification module 124. As will be described in further detail below, the synthetic layout pattern generation module 120 is configured to implement a neural network model for generating synthetic physical design layout patterns. The hotspot detection module 122 is configured to implement another neural network model for classifying synthetic physical design layout patterns as hotspot-free or hotspot-containing. The system 102 takes as input 101 sample physical design layout patterns, and produces as output 103 new synthetic hotspot-containing physical design layout patterns. The input 101 may include both hotspot-containing and hotspot-free physical design layout patterns during training. The synthetic layout pattern generation module 120, for example, may be trained with hotspot-containing physical design layout patterns while the hotspot detection module 122 may be trained using both hotspot-free and hotspot-containing physical design layout patterns.

The neural network models implemented by the synthetic layout pattern generation module 120 and hotspot detection module 122, as will be described in further detail below, may be trained independently. For example, the layout pattern generation neural network model implemented by the synthetic layout pattern generation module 120 may be trained using sample data that includes physical design layout patterns which contain hotspots, such that the layout pattern generation neural network model produces new synthetic physical design layout patterns that are likely to contain hotspots. The hotspot detection neural network model implemented by the hotspot detection module 122 is trained using sample physical design layout patterns with and without hotspots.

After training, the layout pattern generation neural network model and the hotspot detection neural network model may be combined in an automated workflow that includes synthetic physical design layout pattern generation followed by hotspot detection and localization to generate new synthetic physical design layout patterns that contain hotspots. The hotspot verification module 124 is configured to verify the hotspot-containing synthetic physical design layout patterns using EDA software or through wafer verification (e.g., by fabricating the new synthetic physical design layout patterns on a wafer and testing to confirm the presence of hotspots).

Figure 2:
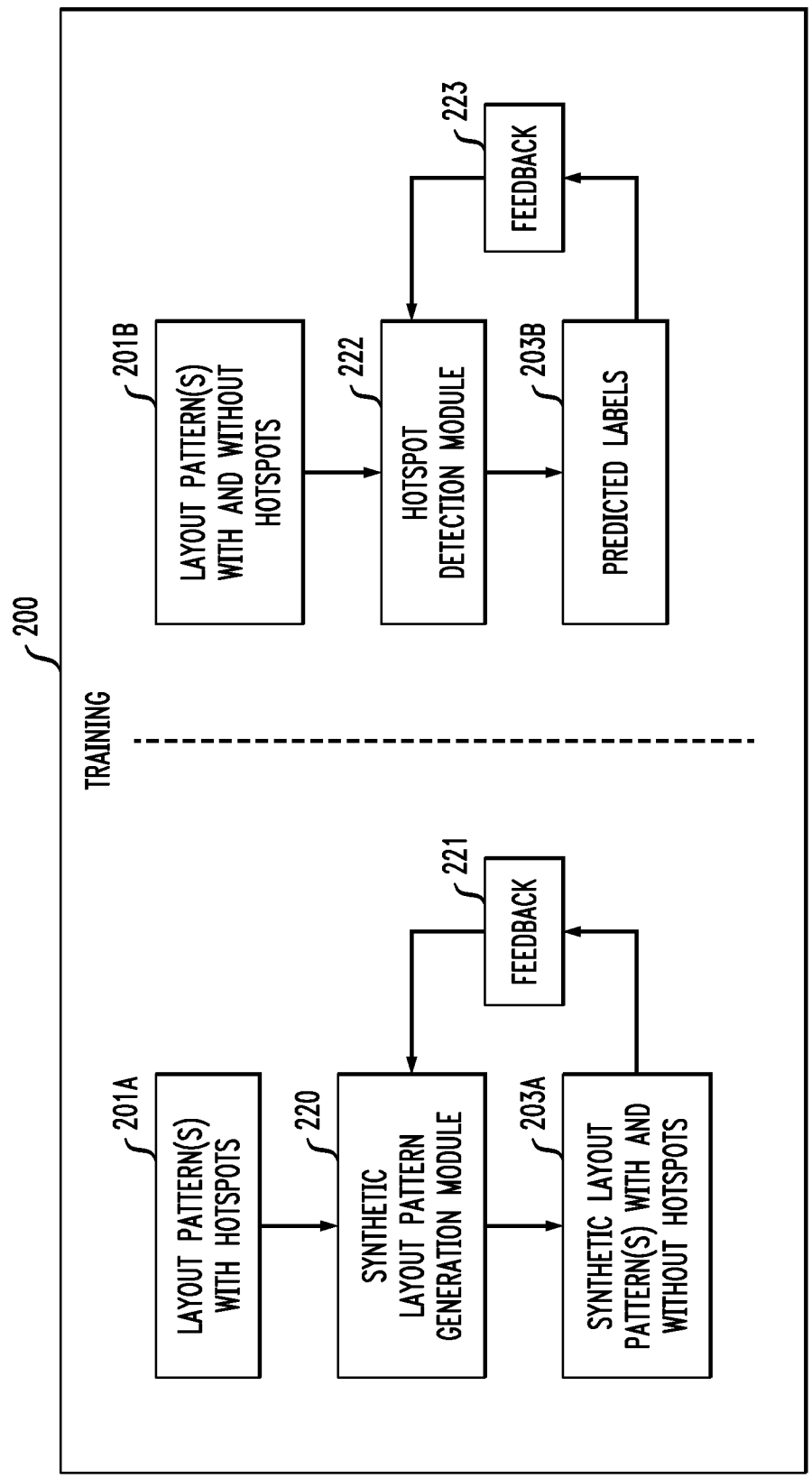
FIG. 2 depicts a training workflow of a system for generating synthetic physical design layout patterns containing hotspots, according to an exemplary embodiment of the present invention.

FIG. 2 shows a training workflow 200 for a layout pattern generation neural network model and a hotspot detection neural network model. The layout pattern generation neural network model and hotspot detection neural network models may comprise respective deep neural network (DNN) models. Various types of deep learning or more generally neural network models may be used for both the layout pattern generation and hotspot detection models. Examples of different types of neural network models which may be used to implement the layout pattern generation and hotspot detection models will be described in further detail below.

During training, the layout pattern generation neural network model (represented as synthetic layout pattern generation module 220) and the hotspot detection neural network model (represented as hotspot detection module 222) are trained independently. The synthetic layout pattern generation module 220 is trained using input 201A that includes physical design layout patterns that contain hotspots. The synthetic layout pattern generation module 220 generates synthetic physical design layout patterns 203A, which may include physical design layout patterns that do and do not contain hotspots.

Using feedback 221, the synthetic layout pattern generation module 220 is tuned such that the output 203A includes synthetic physical design layout patterns that are more likely to contain hotspots. It should be appreciated, however, that after training using feedback 221, it is still possible that some of the synthetic physical design layout patterns produced as output 203A by the synthetic pattern generation module 220 may be hotspot-free. This is addressed through the use of the trained hotspot detection neural network model during inference described in further detail below.

As discussed above, a wide variety of DNN models may be used to implement the synthetic layout pattern generation module 220. For training a DNN to generate synthetic physical design layout patterns, input physical design layout patterns may be represented in various formats, such as in a layout image format, a coordinate array format, etc. Various DNN architectures, including but not limited to generative adversarial networks (GANs), recurrent neural networks (RNNs), and variational autoencoders (VAEs), may work with such different formats of input layout patterns (e.g., with coordinate arrays, layout images, etc.).

In some embodiments, the DNN model used to implement the synthetic layout pattern generation module 220 is a GAN. GANs are a type of neural network that includes two networks, a generator (generative) network and a discriminator (adversarial) network. The generator network takes random input values and transforms them into a desired output, such as a synthetic physical design layout pattern. The discriminator network distinguishes between real and synthetic data, or between real and synthetic physical design layout patterns. After training the generator and discriminator networks competitively, neither network should be able to make further progress against the other. In other words, at the end of training the generator network becomes so good that the discriminator network cannot distinguish between the synthetic physical design layout patterns and the real physical design layout patterns. During inference, the generator network can be used as a standalone model to generate new synthetic physical design layout patterns, which will be similar to real or input physical design layout patterns.

An exemplary embodiment of using a GAN to generate single-layer physical design layout patterns with features such as vias, lines (or segments thereof), etc. using coordinate arrays to represent layout patterns will now be described. In such embodiments, input physical design layout patterns may be converted into coordinate arrays, where each coordinate array comprises feature center coordinates for features in a corresponding physical design layout pattern. The center coordinates may be provided with feature locations ordered in a consistent way, such as from left to right and then from top to bottom in a field of view (FOV). The features may be fixed-size rectangular features, with the coordinate arrays having designated entries for respective ones of the centers of the fixed-size rectangular features.

Each coordinate array may have a size of M×N, where M is the number of values required to represent the center of a feature in a given coordinate system and where N is the maximum number of features in the FOV. Various embodiments are described herein with respect to center coordinates represented in a Cartesian coordinate system (e.g., where M is 2 for the x- and y-axis of layouts). It should be appreciated, however, that various other coordinate systems may be used as desired, possibly with different values of M. An array with fewer than N features may be padded with null values (e.g., 0) that are outside the range of possible coordinates for the FOV. After conversion of the input physical design layout patterns into coordinate arrays, a GAN may be trained using the coordinate arrays. As noted above, the GAN includes a discriminator neural network and a generator neural network. In some embodiments, one or both of the discriminator and generator neural networks may be fully connected neural networks comprising a series of fully connected (FC) neural network layers. In other embodiments, one or both of the discriminator and generator neural networks may be convolutional neural networks (CNNs), recurrent neural networks (RNNs), etc. Synthetic coordinate arrays are generated utilizing the trained generator neural network of the GAN, where the synthetic coordinate arrays comprise feature center coordinates for features for a new physical design layout pattern.

In a similar manner, a GAN or other DNN model for generating synthetic physical design layout patterns may be tuned to produce output that includes hotspot-containing physical design layout patterns through selection of the training data used.

It should be appreciated that the synthetic layout pattern generation neural network model is not limited solely to a GAN. Various other types of DNNs and other neural network models may be used, including RNNs and feedforward neural network (FFNN)-based VAEs.

For example, input arrays (e.g., two-dimensional (2D) arrays which represent feature center coordinates in single-layer physical design layout patterns, three-dimensional (3D) arrays that contain "stacks" of 2D arrays with values representing presence or absence of features in individual layers of an integrated multi-layer, etc.) may be provided as training data to a RNN model that generates synthetic 2D or 3D arrays after training. A RNN is composed of neurons receiving inputs, producing outputs, and sending the outputs back to themselves. At each time step t, a recurrent neuron receives the input x(t) as well as its own output from a previous time step y(t−1).

It is to be appreciated that RNN architectures (e.g., RNN unit cells, etc.) and corresponding hyperparameters can vary case by case. Such hyperparameters can include, but are not limited to, the number of neural network layers, the number of neurons for each neural network layer, and so forth. The types of RNN unit cells can include, but are not limited to, Long Short-Term Memory (LSTM) cells, Gated Recurrent Unit (GRU) cells, etc. In some embodiments, the RNN model may use an architecture that includes a set of LSTM or GRU cells, each connected to a FC layer. It should be appreciated that in other embodiments, such those involving more complex architectures, multiple LSTMs or GRU cells can be stacked on top of each other. These and other variations of an RNN architecture may be used in other embodiments.

In some embodiments, a VAE may be used to generate physical design layout patterns with features such as vias, lines (or segments thereof), etc. using layout images to represent layout patterns instead of coordinate arrays. Layout images, suitably converted to the form of 2D and 3D arrays, may be provided as training data of single-layer or multi-layer layout patterns to a DNN model.

Single-layer physical design layout patterns may be converted into 2D arrays, where each 2D array may have a size of W×H, where W represents a width of the FOV, and H represents a height of the FOV. Entries of the 2D arrays may comprise values indicating presence of a given feature at respective positions in the FOV for the given single-layer physical design layout pattern.

Multi-layer physical design layout patterns may be converted into 3D arrays, where each 3D array comprises a set of 2D arrays with each 2D array representing features of one of the layers in a given physical design layout pattern. Each of the 3D arrays may have a size of W×H×N, where W represents a width of the FOV, H represents a height of the FOV, and N represents the number of layers the physical design layout pattern of integrated multi-layers. Entries of the 3D arrays may comprise values indicating presence of a given feature at respective positions in the FOV for a corresponding layer of the given physical design layout pattern of integrated multi-layers.

Layout images, in the form of 2D or 3D arrays, may be provided to FFNN-based VAEs or other types of DNNs that generate synthetic 2D or 3D arrays representing synthetic single-layer or multi-layer layout patterns after training. VAEs are a type of autoencoder, which is a type of unsupervised artificial neural network (ANN) that learns to copy its inputs to its outputs. An autoencoder is composed of two parts, namely an encoder (e.g., a recognition network) and a decoder (e.g., a generative network). The encoder converts the inputs to an internal representation or codings, and the decoder converts the internal representation or codings to outputs that closely match the inputs. The codings typically have a much lower dimensionality than the input data, which makes an autoencoder useful for dimensionality reduction.

VAEs are probabilistic in that their outputs are partially determined by chance, even after training. VAEs are also generative in that they generate new instances that look like they were sampled from the training set. In a VAE architecture, the encoder produces mean codings $\mu$ and standard deviation codings $\sigma$, rather than deterministic codings. The actual codings are then sampled randomly from a Gaussian distribution with mean $\mu$ and standard deviation $\sigma$. The decoder takes the actual codings and decodes them normally to match outputs to inputs.

Various types of VAE architectures may be used, with an input layer, one or more hidden layers, and an output layer. Different ones or sets of the hidden layers may be considered as forming encoder and decoder parts of a VAE. The hidden layers perform dimensional reduction (encoder) or dimensional expansion (decoder) using various activation functions applied to the inputs thereof.

The VAE may include a FFNN architecture in which a set of layout images are provide as input (possibly converted to 2D or 3D arrays as discussed above), which are encoded using a set of FC neural network layers to provide a set of codings. The encoding operation first "flattens" the set of layout images. That is, each FC hidden layer forming the encoder dimensionally reduces the set of layout images such that the codings most efficiently and accurately represent the set of layout images in the encoding process. The codings are then decoded by a decoder using another set of FC neural network layers. The decoding operation essentially "unflattens" the codings. As output, a set of reconstructed synthetic layout images that closely resembles the set of input layout images is provided.

The VAE may alternatively use a CNN as the FFNN architecture. In the CNN FFNN architecture, a set of layout images is provided as input. A set of CNN layers is used to encode the set of layout images to provide a set of codings. The CNN layers may include convolutional layers, pooling layers, and normalization layers. The encoding operation essentially "flattens" the input layout images. That is, each layer forming the encoder dimensionally reduces the set of layout images such that the codings most efficiently and accurately represent the set of layout images in the encoding process. The decoder similarly uses CNN layers such as convolutional layers, pooling layers, and normalization layers to perform the decode operation.

It is to be appreciated that hyperparameters used for the FFNN-based VAE can vary case by case. Such hyperparameters can include, but are not limited to, the number of neural network layers, the number of neurons for each neural network layer, etc.

It should be appreciated that synthetic layout pattern generation with layout images as the input layout format is not limited solely to FFNN-based VAEs. Various other types of DNNs and other neural network models may be used, including GANs.

The hotspot detection module 222 is trained independent of the synthetic layout pattern generation module 220. The hotspot detection module 222 is trained using input 201B that includes physical design layout patterns with and without hotspots. The hotspot detection module 222 provides as output 203B predicted labels for the input physical design layout patterns. The input 203A may include "known" physical design layout patterns (e.g., patterns for which it is known a priori whether such patterns contain hotspots). Through feedback 223, the hotspot detection module 222 is trained to accurately predict whether the input physical design layout patterns contain hotspots.

Similar to the synthetic layout pattern generation module 220, a wide variety of DNN models may be used to implement the hotspot detection module 222. For example, deep CNNs may be used to build a neural network model for hotspot detection in some embodiments. As discussed above, a physical design layout pattern may include multiple layers. The hotspot detection module 222 can be trained to perform classification across multiple layers at the same time, providing multiple channels for classification and localization to identify hotspots that may result from overlay errors from specific layers of integrated multi-layer layouts. In some embodiments, the hotspot detection module 222 may be further configured to classify or specify different kinds of hotspots. The input physical design layout patterns 201B may be classified with a first value to indicate that no hotspots are present, a second value to indicate that a hotspot of a first type is present, a third value to indicate that a hotspot of a second type is present, etc. The hotspot detection module 222 may thus indicate whether a hotspot is present and also indicate which type of hotspot is present through appropriate labeling. The hotspot detection module 222 in some embodiments generates as output not only predicted labels 203B, but also a "heat map" that localizes hotspots within the physical design layout patterns. The heat map can indicate which part(s) of a given physical design layout pattern lead the trained deep neural network model to its final classification decision, such as showing with greater intensity the region in which the hotspot occurs.

The hotspot detection module 222 may utilize ANNs to provide image classification. An ANN is an information processing system that is inspired by biological nervous systems, such as the brain. The key element of ANNs is the structure of the information processing system, which includes a large number of highly interconnected processing elements (referred to as "neurons") working in parallel to solve specific problems. ANNs are furthermore trained in-use, with learning that involves adjustments to weights that exist between the neurons. An ANN is configured for a specific application, such as pattern recognition or data classification, through such a learning process.

It should be understood that neural networks are flexible constructs that can take many different forms. However, the universal approximation theorem states that a feed-forward network can represent a wide variety of real-valued functions. ANNs may be analog-valued or hardware-based, or may be implemented using a software deep neural network that is implemented on general-purpose processing hardware such as, e.g., a graphics processing unit (GPU).

ANNs demonstrate an ability to derive meaning from complicated or imprecise data and can be used to extract patterns and detect trends that are too complex to be detected by humans or other computer-based systems. The structure of a neural network has input neurons that provide information to one or more "hidden" neurons. Connections between the input neurons and hidden neurons are weighted, and these weighted inputs are then processed by the hidden neurons according to some function in the hidden neurons, with weighted connections between the layers. There may be any number of layers of hidden neurons, and as well as neurons that perform different functions. Various different types of neural network structures may be used as will, including but not limited to CNNs, FFNNs, etc. A set of output neurons accepts and processes weighted input from the last set of hidden neurons. This architecture represents a feedforward computation where information propagates from input neurons to the output neurons. Upon completion of a feed-forward computation, the output is compared to a desired output available from training data. The error relative to the training data is then processed in feedback computation, where the hidden neurons and input neurons receive information regarding the error propagating backward from the output neurons. Once the backward error propagation has been completed, weight updates are performed, with the weighted connections being updated to account for the received error. This represents just one variety of ANN.

As discussed above, the ANN may take the form of a CNN that includes, among the hidden layers, convolutional layers, pooling layers, FC layers, and normalization layers. The CNN performs a cross-correlation to identify features of circuit design layouts or more generally patterned structures that correspond to hotspots. The CNN is also able to process multiple channels simultaneously. The characteristics of the CNN may be determined as hyperparameters that include, for example, the number of neural network layers, the type of neural network layers, the number of neurons in each neural network layer, the numbers and sizes of filters, etc. The values for the hyperparameters may be based on factors such as input multi-layer integrated patterns, training accuracy targets, available computing resources, etc.

Figure 3:
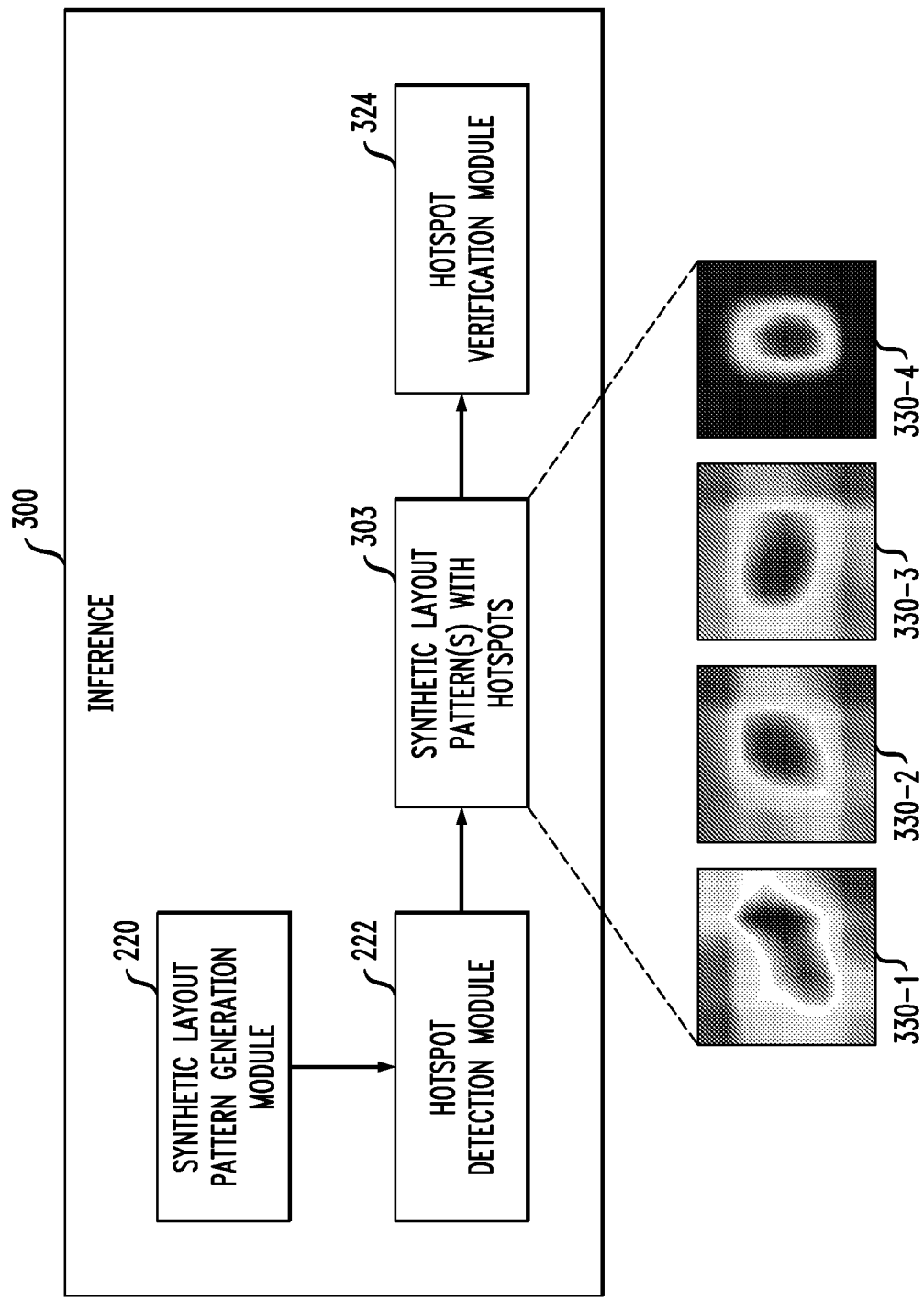
FIG. 3 depicts an inference workflow using a trained system for generating synthetic physical design layout patterns containing hotspots, according to an exemplary embodiment of the present invention.

FIG. 3 shows an inference workflow 300 utilizing a trained layout pattern generation neural network model (e.g., a trained version of synthetic layout pattern generation module 220) and a trained hotspot detection neural network model (e.g., a trained version of hotspot detection module 222). During inference, the trained synthetic layout pattern generation module 220 generates new synthetic physical design layout patterns, which are similar to known physical design layout patterns that contain hotspots (e.g., that are similar to the training input data 201A). After training, the output of the synthetic layout pattern generation module 220 should include new synthetic physical design layout patterns that contain hotspots, though this is not a requirement and it is possible that one or more of the new synthetic physical design layout patterns do not contain hotspots. Thus, the trained hotspot detection module 222 is used as a "gate" to ensure that only hotspot-containing synthetic physical design layout patterns are provided as output 303. FIG. 3 shows examples 330-1 through 330-4 of the output 303, which include synthetic physical design layout patterns overlayed with the above-described heat maps showing the locations of hotspots.

A hotspot verification module 324 analyzes the output to verify the hotspots and to evaluate manufacturability of the new synthetic physical design layout patterns. Verification may be achieved via simulation in EDA software, or on a wafer through fabrication and analysis of the new hotspot-containing physical design layout patterns.

Figure 4A:
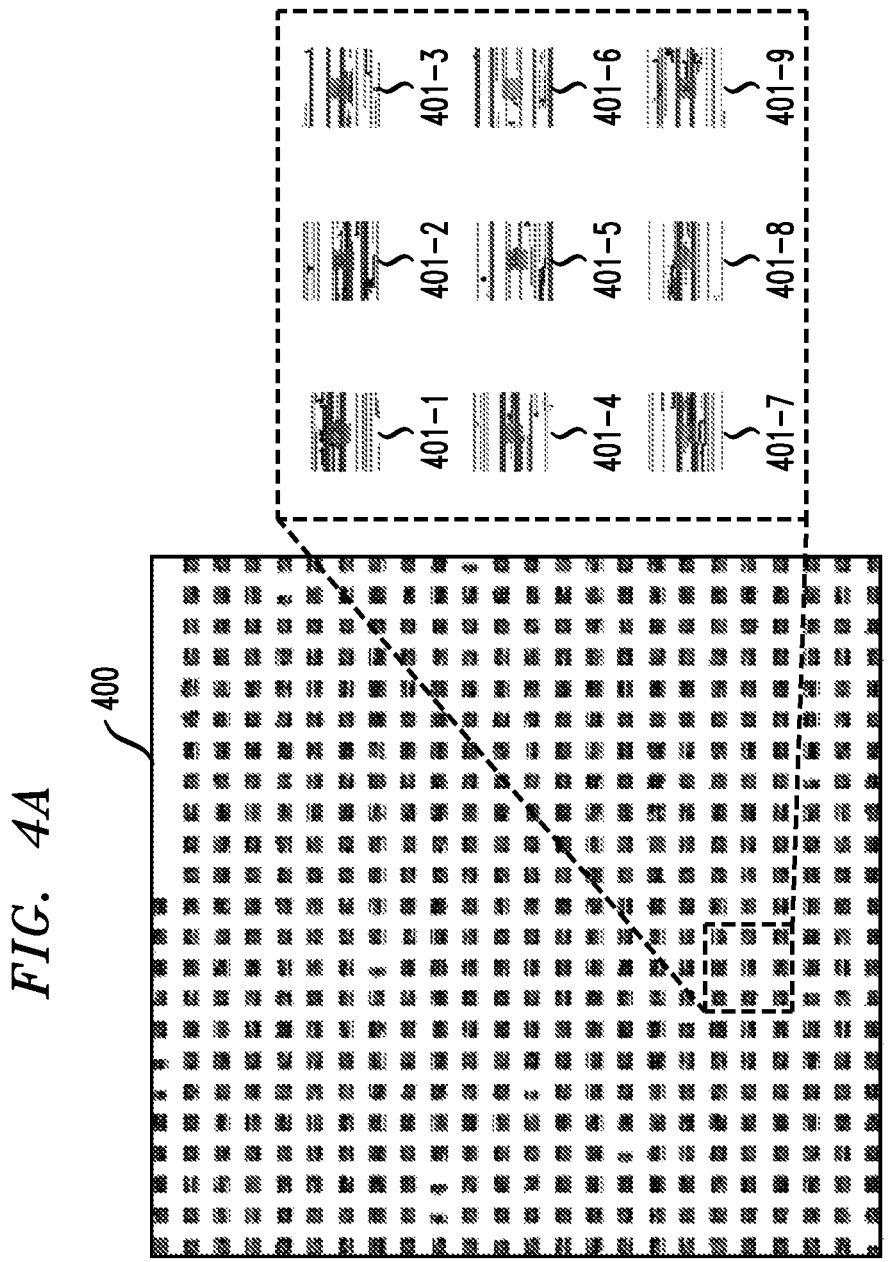
FIG. 4A depicts a set of training images including physical design layout patterns with hotspots, according to an exemplary embodiment of the present invention.
Figure 4B:
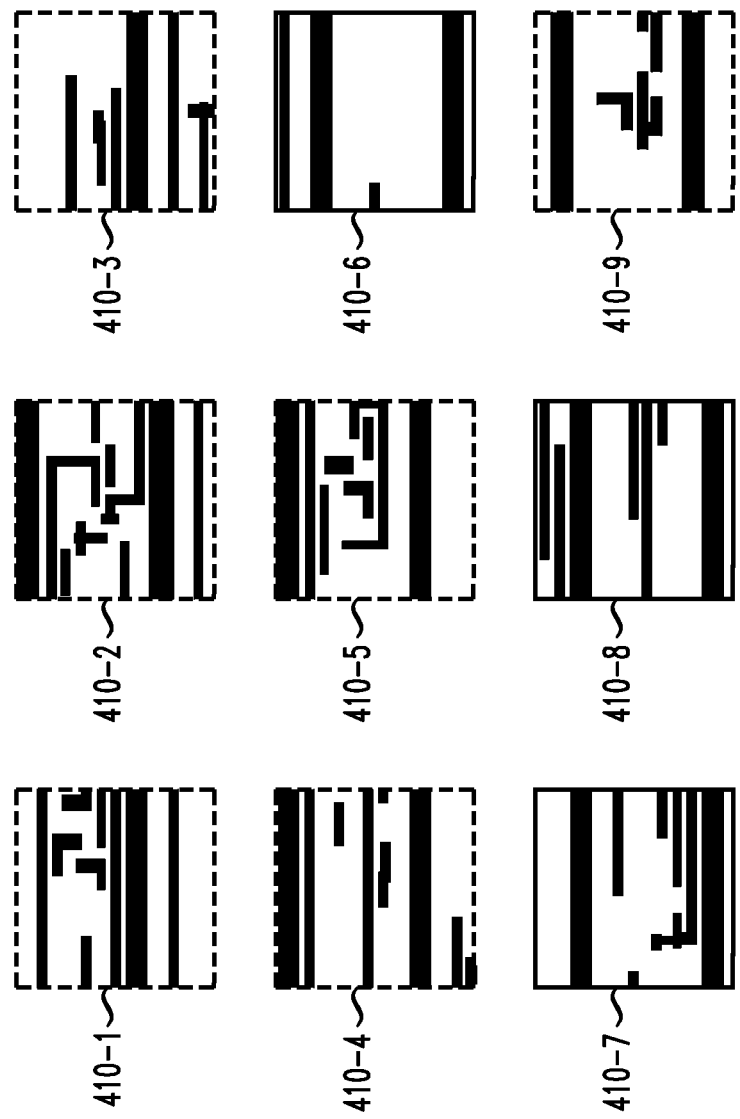
FIG. 4B depicts a zoomed-in view of portions of the training images, according to an exemplary embodiment of the present invention.

FIG. 4A shows a set of training images 400, which includes a number of physical design layout pattern images with hotspots. FIG. 4A also shows an enlarged view of nine of the physical design layout patterns, denoted 401-1 through 401-9. While each physical design layout pattern in the training image data 400 is assumed to include at least one hotspot, it is to be appreciated that not every FOV of every physical design layout pattern contains a hotspot. In the FIG. 4A example, physical design layout patterns 401-1 through 401-9 each contain at least one hotspot, though not necessarily in the highlighted FOV (e.g., the "cover" in gray shading) of that physical design layout pattern. Physical design layout patterns 401-1 through 401-5 and 401-9 each include a hotspot in the highlighted FOV, while physical design layout patterns 401-6 through 401-8 do not include a hotspot in the highlighted FOV. FIG. 4B shows zoomed-in views 410-1 through 410-9 of the highlighted FOVs for physical design layout patterns 401-1 through 401-9, respectively. The highlighted FOVs 410 which contain hotspots have dashed outline (e.g., 410-1 through 410-5 and 410-9) and the highlighted FOVs which do not contain hotspots have solid outline (e.g., 410-6 through 410-8).

Figure 5:
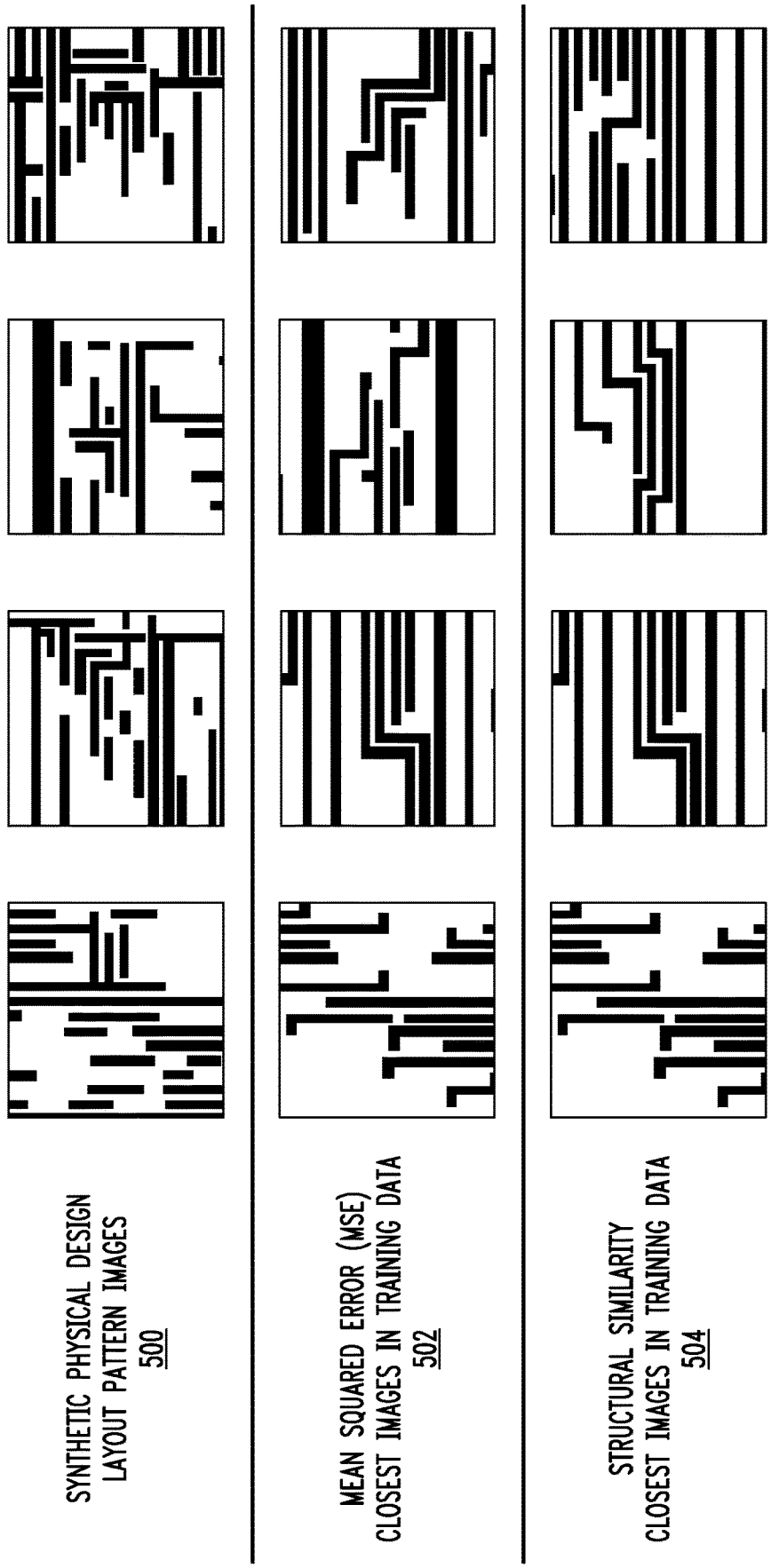
FIG. 5 depicts a set of synthetic physical design layout patterns along with corresponding closest training images for the set of synthetic physical design layout patterns, according to an exemplary embodiment of the present invention.

FIG. 5 shows a set of synthetic physical design layout pattern images 500 generated using the automated workflow combining a synthetic layout pattern generation neural network model and hotspot detection neural network model. FIG. 5 also shows images from the data used to train such neural network models that are "closest" to the generated or synthetic images 500. The "closest" images shown include a set of mean squared error (MSE) closest images 502 in the training data, as well as a set of structurally similar closest images 504 in the training data. FIG. 5 highlights the ability of the trained neural network models to generate realistic synthetic layout patterns that look "similar" to real layout patterns.

Figure 6:
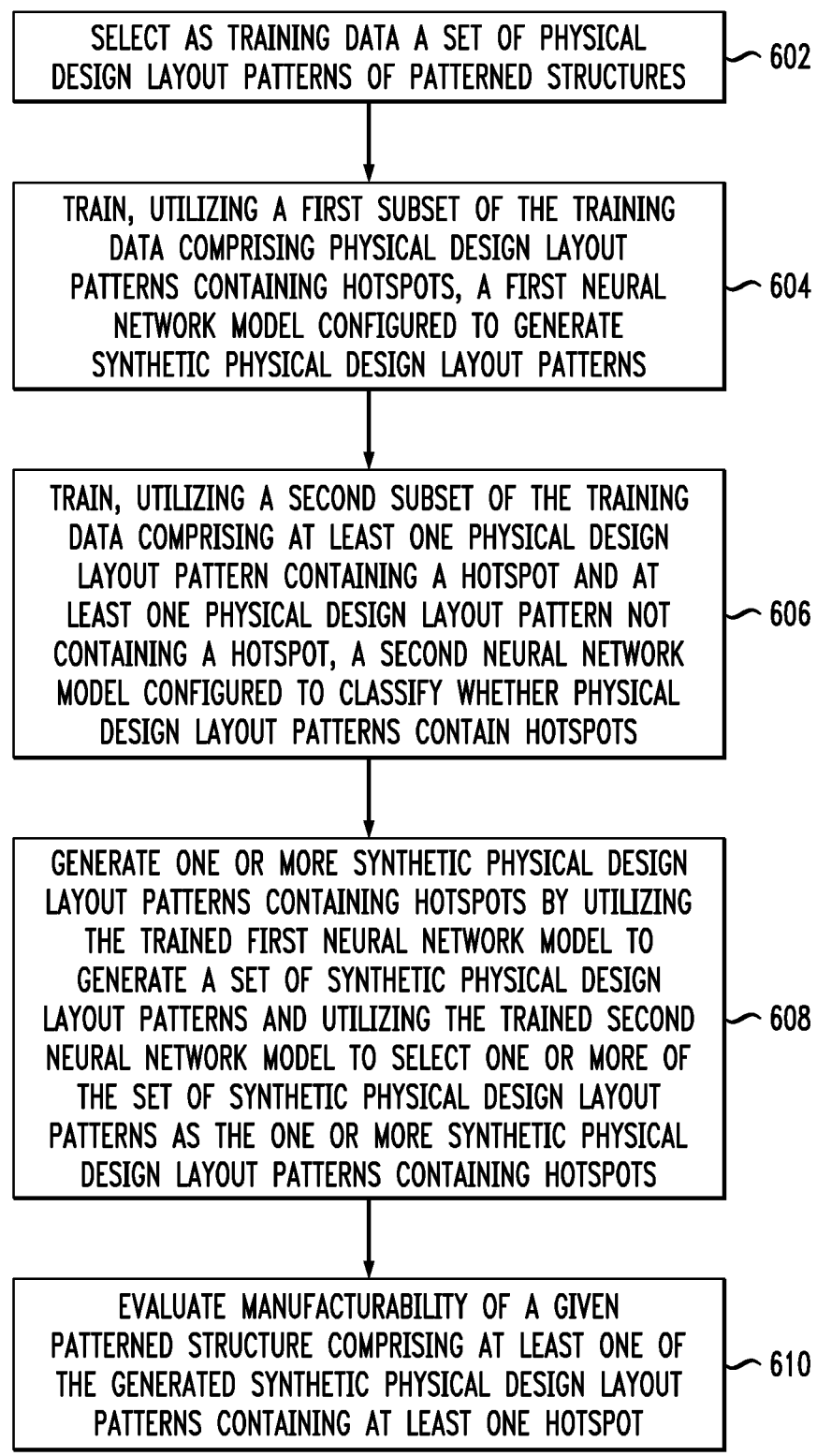
FIG. 6 depicts a workflow for generating synthetic physical design layout patterns containing hotspots, according to an exemplary embodiment of the present invention.

FIG. 6 shows a workflow 600 for generating physical design layout patterns containing hotspots. A hotspot in some embodiments represents an area of a physical design layout pattern that at least one of: is not manufacturable; and renders at least a portion of a patterned structure comprising the hotspot inoperable. The workflow 600 begins with step 602, selecting as training data a set of physical design layout patterns of patterned structures. In step 604, a first subset of the training data comprising physical design layout patterns containing hotspots is utilized to train a first neural network model configured to generate synthetic physical design layout patterns. In step 606, a second subset of the training data comprising at least one physical design layout pattern containing a hotspot and at least one physical design layout pattern not containing a hotspot is utilized to train a second neural network model configured to classify whether physical design layout patterns contain hotspots.

A wide variety of different types of DNNs may be used to implement the first and second neural network models. In some embodiments, the first neural network model comprises a GAN comprising a generator neural network and a discriminator neural network. The generator neural network and the discriminator neural network of the GAN may comprise respective CNNs. The generator neural network of the GAN may comprise an input layer, a projection layer, a series of deconvolutional layers and an output layer. The discriminator neural network of the GAN may comprise an input layer, a series of one or more convolutional layers, batch normalization and leaky rectified linear unit (L-ReLU) activation functions, a fully connected layer, and a softmax output layer. The discriminator and generator neural networks of the GAN may alternatively comprise respective series of FC neural network layers.

In other embodiments, the first neural network model may comprise a RNN. The RNN may comprise a set of neural network layers each comprising one or more RNN unit cells connected to a FC layer. The one or more RNN unit cells may comprise LSTM cells, GRU cells, or combinations of these and other types of RNN unit cells.

In other embodiments, the first neural network model may comprise a FFNN-based VAE. The FFNN-based VAE may comprise a set of FC layers, a set of convolutional, pooling and normalization layers, etc.

The second neural network model may comprise a CNN or other DNN.

In step 608, one or more synthetic physical design layout patterns containing hotspots are generated. Step 608 may include utilizing the trained first neural network model to generate a set of synthetic physical design layout patterns, and utilizing the trained second neural network model to select one or more of the set of synthetic physical design layout patterns as the one or more synthetic physical design layout patterns containing hotspots. In step 610, the one or more synthetic physical design layout patterns containing hotspots are utilized to evaluate manufacturability of a given patterned structure comprising at least one of the synthetic physical design layout patterns containing at least one hotspot.

In some embodiments, step 610 includes performing a manufacturability study by at least one of process simulation and wafer verification of the one or more synthetic physical design layout patterns containing hotspots. In other embodiments, step 610 includes performing a failure mode analysis on the given patterned structure using the one or more synthetic physical design layout patterns containing hotspots, and modifying at least one of the synthetic physical design layout patterns containing hotspots to correct at least one failure identified by the failure mode analysis.

In some embodiments, the training data is converted from a layout format supported by an EDA software to a set of arrays for input to the first and second neural network models. The synthetic physical design layout patterns in some embodiments are converted from arrays into a layout format supported by the EDA software.

Embodiments of the present invention include a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Python, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 7:
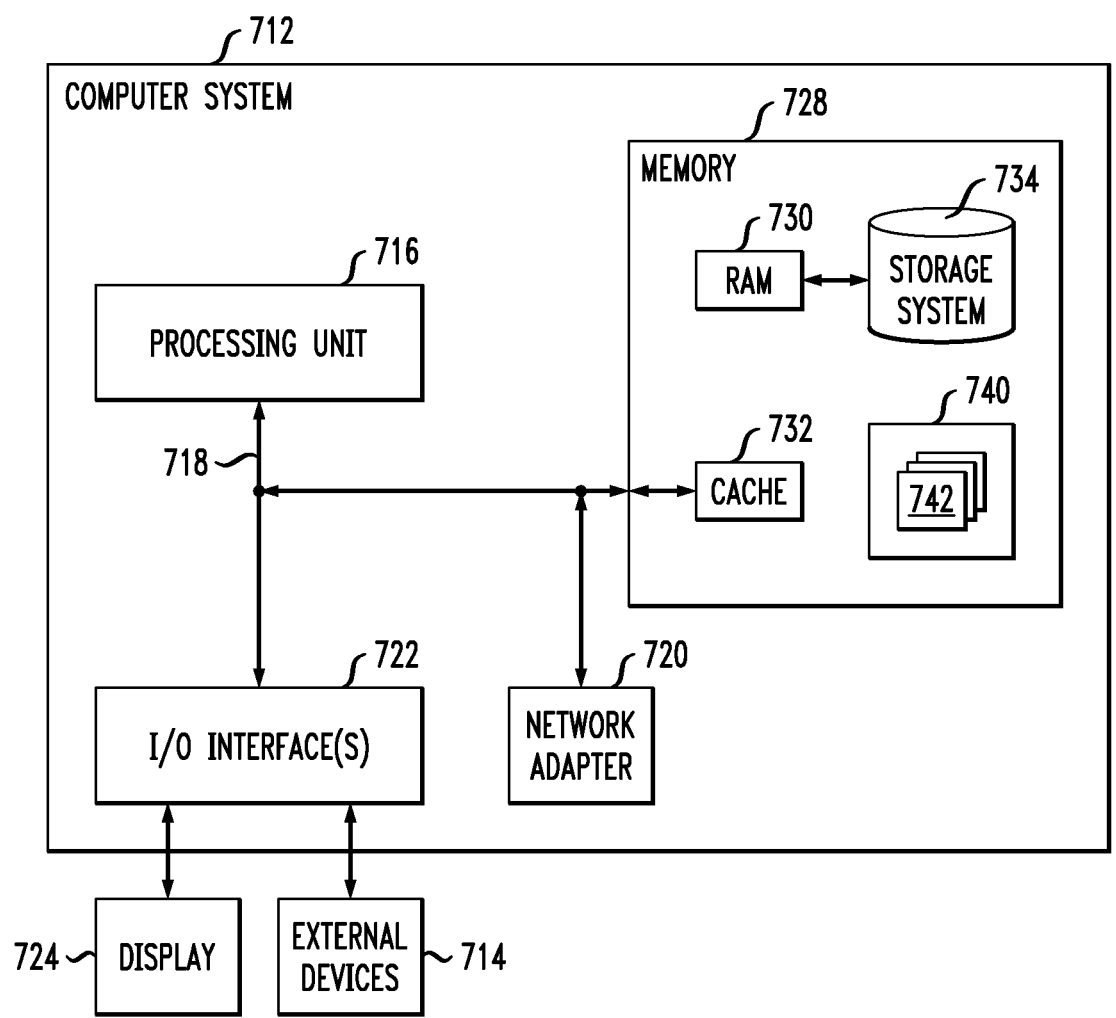
FIG. 7 depicts a computer system in accordance with which one or more components/steps of techniques of the invention may be implemented, according to an exemplary embodiment of the invention.

One or more embodiments can make use of software running on a general-purpose computer or workstation. With reference to FIG. 7, in a computing node 710 there is a computer system/server 712, which is operational with numerous other general purpose or special purpose computing system environments or configurations. Examples of well-known computing systems, environments, and/or configurations that may be suitable for use with computer system/server 712 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, mobile and wearable devices, and distributed cloud computing environments that include any of the above systems or devices, and the like.

Computer system/server 712 may be described in the general context of computer system executable instructions, such as program modules, being executed by a computer system. Generally, program modules may include routines, programs, objects, components, logic, data structures, and so on that perform particular tasks or implement particular abstract data types. Computer system/server 712 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 7, computer system/server 712 in computing node 710 is shown in the form of a general-purpose computing device. The components of computer system/server 712 may include, but are not limited to, one or more processors or processing units 716, a system memory 728, and a bus 718 that couples various system components including system memory 728 to processor 716.

The bus 718 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer system/server 712 typically includes a variety of computer system readable media. Such media may be any available media that is accessible by computer system/server 712, and it includes both volatile and non-volatile media, removable and non-removable media.

The system memory 728 can include computer system readable media in the form of volatile memory, such as random access memory (RAM) 730 and/or cache memory 732. The computer system/server 712 may further include other removable/non-removable, volatile/nonvolatile computer system storage media. By way of example only, storage system 734 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to the bus 718 by one or more data media interfaces. As depicted and described herein, the memory 728 may include at least one program product having a set (e.g., at least one) of program modules that are configured to carry out the functions of embodiments of the invention. A program/utility 740, having a set (at least one) of program modules 742, may be stored in memory 728 by way of example, and not limitation, as well as an operating system, one or more application programs, other program modules, and program data. Each of the operating system, one or more application programs, other program modules, and program data or some combination thereof, may include an implementation of a networking environment. Program modules 742 generally carry out the functions and/or methodologies of embodiments of the invention as described herein.

Computer system/server 712 may also communicate with one or more external devices 714 such as a keyboard, a pointing device, a display 724, etc., one or more devices that enable a user to interact with computer system/server 712, and/or any devices (e.g., network card, modem, etc.) that enable computer system/server 712 to communicate with one or more other computing devices. Such communication can occur via I/O interfaces 722. Still yet, computer system/server 712 can communicate with one or more networks such as a LAN, a general WAN, and/or a public network (e.g., the Internet) via network adapter 720. As depicted, network adapter 720 communicates with the other components of computer system/server 712 via bus 718. It should be understood that although not shown, other hardware and/or software components could be used in conjunction with computer system/server 712. Examples include, but are not limited to, microcode, device drivers, redundant processing units, external disk drive arrays, RAID systems, tape drives, and data archival storage systems, etc.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 8:
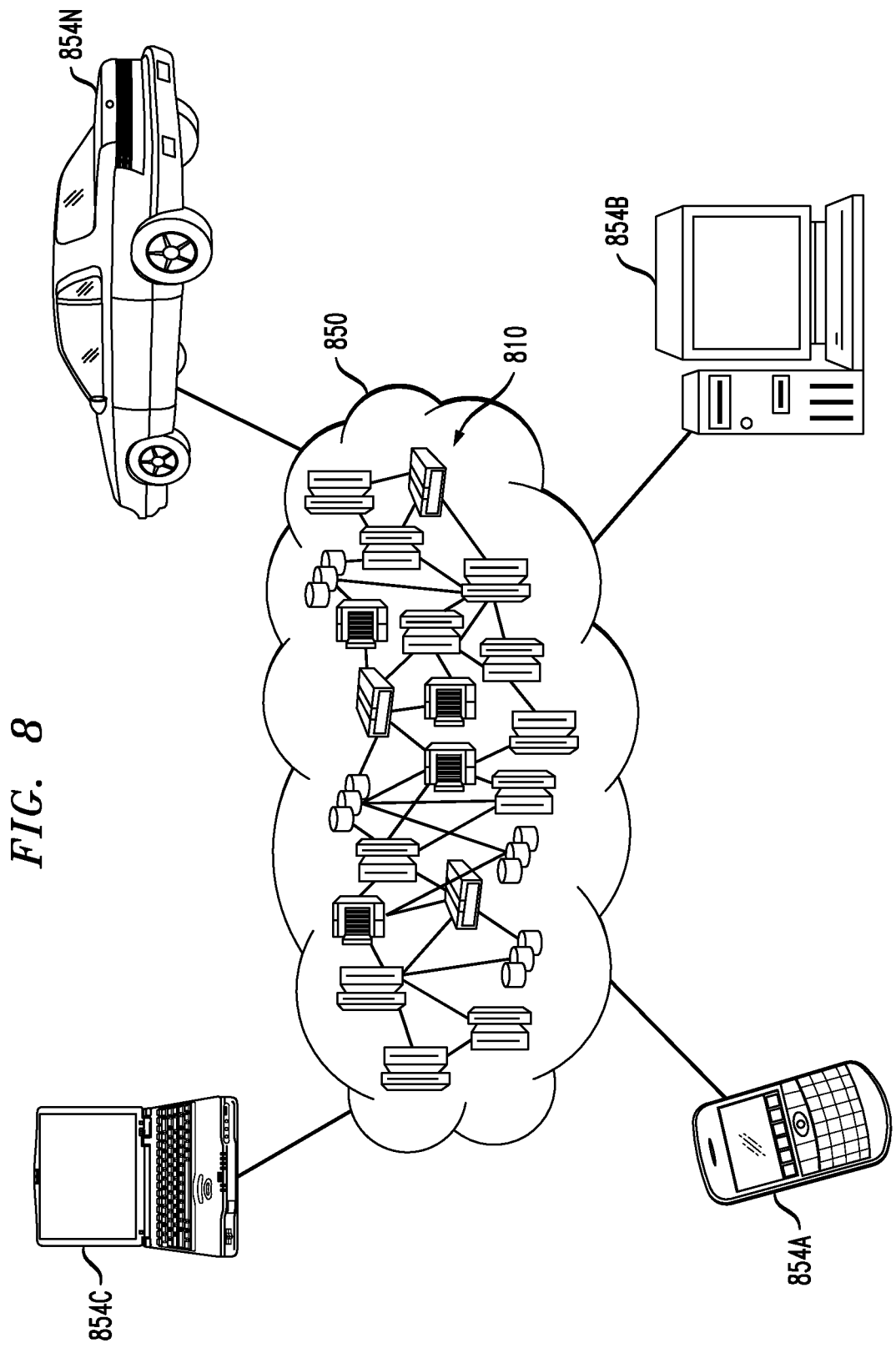
FIG. 8 depicts a cloud computing environment, according to an exemplary embodiment of the present invention.

Referring now to FIG. 8, illustrative cloud computing environment 850 is depicted. As shown, cloud computing environment 850 includes one or more cloud computing nodes 810 with which local computing devices used by cloud consumers, such as, for example, personal digital assistant (PDA) or cellular telephone 854A, desktop computer 854B, laptop computer 854C, and/or automobile computer system 854N may communicate. Nodes 810 may communicate with one another. They may be grouped (not shown) physically or virtually, in one or more networks, such as Private, Community, Public, or Hybrid clouds as described hereinabove, or a combination thereof. This allows cloud computing environment 850 to offer infrastructure, platforms and/or software as services for which a cloud consumer does not need to maintain resources on a local computing device. It is understood that the types of computing devices 854A-N shown in FIG. 8 are intended to be illustrative only and that computing nodes 810 and cloud computing environment 850 can communicate with any type of computerized device over any type of network and/or network addressable connection (e.g., using a web browser).

Figure 9:
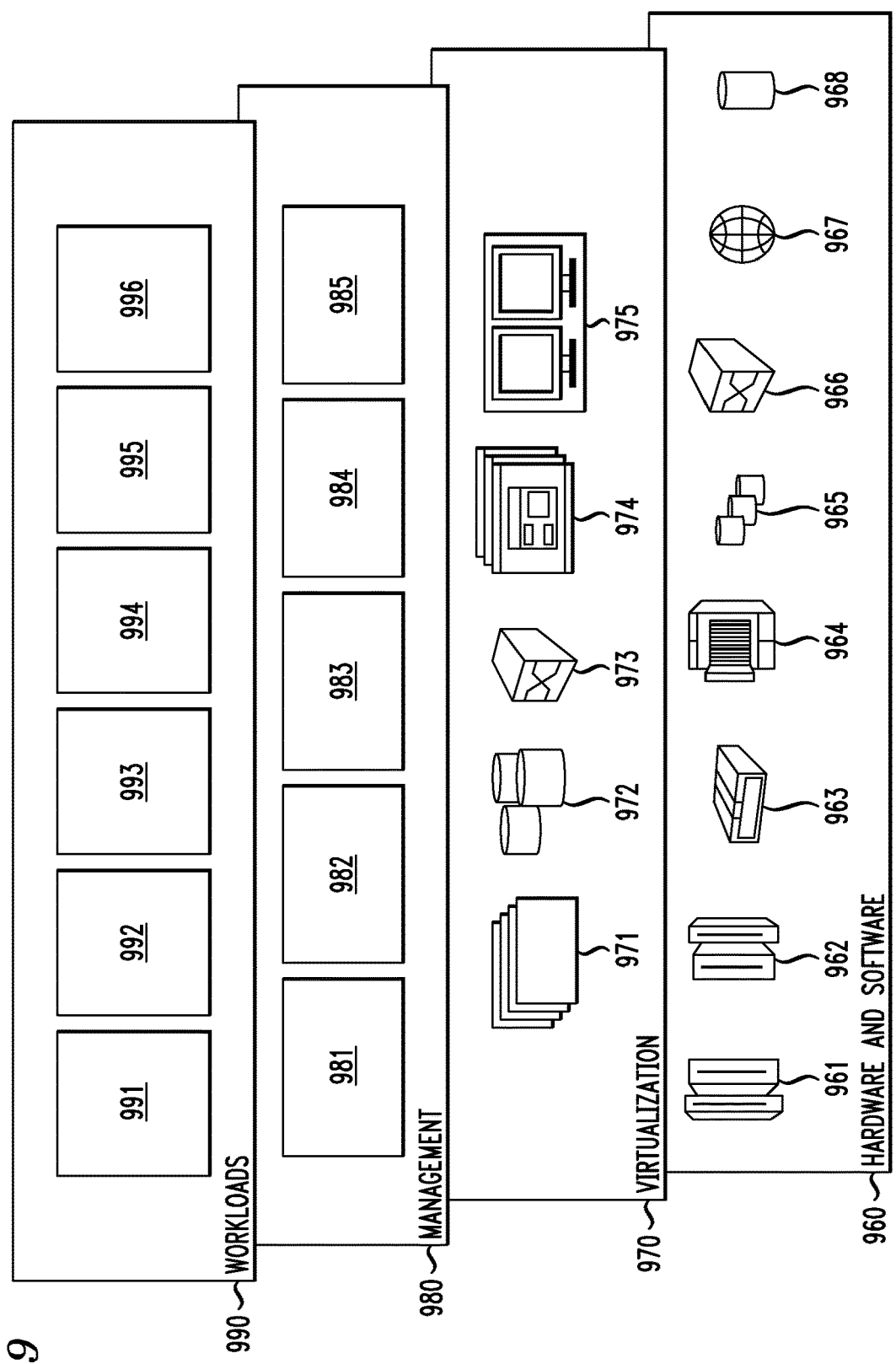
FIG. 9 depicts abstraction model layers, according to an exemplary embodiment of the present invention.

Referring now to FIG. 9, a set of functional abstraction layers provided by cloud computing environment 850 (FIG. 8) is shown. It should be understood in advance that the components, layers, and functions shown in FIG. 9 are intended to be illustrative only and embodiments of the invention are not limited thereto. As depicted, the following layers and corresponding functions are provided:

Hardware and software layer 960 includes hardware and software components. Examples of hardware components include: mainframes 961; RISC (Reduced Instruction Set Computer) architecture based servers 962; servers 963; blade servers 964; storage devices 965; and networks and networking components 966. In some embodiments, software components include network application server software 967 and database software 968.

Virtualization layer 970 provides an abstraction layer from which the following examples of virtual entities may be provided: virtual servers 971; virtual storage 972; virtual networks 973, including virtual private networks; virtual applications and operating systems 974; and virtual clients 975.

In one example, management layer 980 may provide the functions described below. Resource provisioning 981 provides dynamic procurement of computing resources and other resources that are utilized to perform tasks within the cloud computing environment. Metering and Pricing 982 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 983 provides access to the cloud computing environment for consumers and system administrators. Service level management 984 provides cloud computing resource allocation and management such that required service levels are met. Service Level Agreement (SLA) planning and fulfillment 985 provide pre-arrangement for, and procurement of, cloud computing resources for which a future requirement is anticipated in accordance with an SLA.

Workloads layer 990 provides examples of functionality for which the cloud computing environment may be utilized. Examples of workloads and functions which may be provided from this layer include: mapping and navigation 991; software development and lifecycle management 992; virtual classroom education delivery 993; data analytics processing 994; transaction processing 995; and synthetic physical design layout pattern generation processing 996, which may perform various functions described above with respect to generating synthetic physical design layout patterns containing hotspots using the techniques described herein.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for generating physical design layout patterns, comprising steps of:
    selecting as training data a set of physical design layout patterns of patterned structures;
    training, utilizing a first subset of the training data comprising physical design layout patterns containing hotspots, a first neural network model configured to generate synthetic physical design layout patterns;
    training, utilizing a second subset of the training data comprising at least one physical design layout pattern containing a hotspot and at least one physical design layout pattern not containing a hotspot, a second neural network model configured to classify whether physical design layout patterns contain hotspots;
    generating one or more synthetic physical design layout patterns containing hotspots, wherein generating the one or more synthetic physical design layout patterns containing hotspots comprises utilizing the trained first neural network model to generate a set of synthetic physical design layout patterns and utilizing the trained second neural network model to select one or more of the set of synthetic physical design layout patterns as the one or more synthetic physical design layout patterns containing hotspots; and
    evaluating manufacturability of a given patterned structure comprising at least one of the generated synthetic physical design layout patterns containing at least one hotspot;
    wherein the method is performed by at least one processing device comprising a processor coupled to a memory.

2. The method of claim 1, wherein the first neural network model comprises a generative adversarial network comprising a generator neural network and a discriminator neural network.

3. The method of claim 2, wherein the generator neural network and the discriminator neural network comprise respective convolutional neural networks.

4. The method of claim 3, wherein the generator neural network comprises an input layer, a projection layer, a series of deconvolutional layers and an output layer.

5. The method of claim 3, wherein the discriminator neural network comprises: an input layer; a series of one or more convolutional layers, batch normalization and leaky rectified linear unit (L-ReLU) activation functions; a fully connected layer; and a softmax output layer.

6. The method of claim 2, wherein at least one of the discriminator and generator neural networks comprise a series of fully connected neural network layers.

7. The method of claim 1, wherein the first neural network model comprises a recurrent neural network.

8. The method of claim 7, wherein the recurrent neural network comprises a set of neural network layers each comprising one or more recurrent neural network unit cells connected to a fully connected layer, the one or more recurrent neural network unit cells comprising at least one of Long Short-Term Memory (LSTM) cells and Gated Recurrent Unit (GRU) cells.

9. The method of claim 1, wherein the first neural network model comprises a feedforward neural network (FFNN)-based Variational Autoencoder (VAE).

10. The method of claim 9, wherein the FFNN-based VAE comprises at least one of: a set of fully connected layers; and a set of convolutional, pooling and normalization layers.

11. The method of claim 1, wherein the second neural network model comprises a convolutional neural network.

12. The method of claim 1, wherein evaluating manufacturability of the given patterned structure comprises performing a manufacturability study by at least one of process simulation and wafer verification of the one or more synthetic physical design layout patterns containing hotspots.

13. The method of claim 1, wherein evaluating manufacturability of the given patterned structure comprises:
    performing a failure mode analysis on the given patterned structure using the one or more synthetic physical design layout patterns containing hotspots; and
    modifying at least one of the synthetic physical design layout patterns containing hotspots to correct at least one failure identified by the failure mode analysis.

14. The method of claim 1, wherein a hotspot represents an area of a physical design layout pattern that at least one of: is not manufacturable; and renders at least a portion of a patterned structure comprising the hotspot inoperable.

15. The method of claim 1, further comprising converting the training data from a layout format supported by an electronic design automation (EDA) software to a set of arrays for input to the first and second neural network models.

16. The method of claim 1, further comprising converting the synthetic physical design layout patterns containing hotspots to a layout format supported by an electronic design automation (EDA) software.

17. A computer program product, the computer program product comprising a computer readable storage medium having program instructions embodied therewith, the program instructions executable by at least one computing device to cause the at least one computing device to perform steps of:
    selecting as training data a set of physical design layout patterns of patterned structures;
    training, utilizing a first subset of the training data comprising physical design layout patterns containing hotspots, a first neural network model configured to generate synthetic physical design layout patterns;
    training, utilizing a second subset of the training data comprising at least one physical design layout pattern containing a hotspot and at least one physical design layout pattern not containing a hotspot, a second neural network model configured to classify whether physical design layout patterns contain hotspots;

generating one or more synthetic physical design layout patterns containing hotspots, wherein generating the one or more synthetic physical design layout patterns containing hotspots comprises utilizing the trained first neural network model to generate a set of synthetic physical design layout patterns and utilizing the trained second neural network model to select one or more of the set of synthetic physical design layout patterns as the one or more synthetic physical design layout patterns containing hotspots; and evaluating manufacturability of a given patterned structure comprising at least one of the generated synthetic physical design layout patterns containing at least one hotspot.

18. The computer program product of claim 17, wherein a hotspot represents an area of a physical design layout pattern that at least one of: is not manufacturable; and renders at least a portion of a patterned structure comprising the hotspot inoperable.

19. An apparatus comprising:

a memory; and at least one processor coupled to the memory and configured for:

selecting as training data a set of physical design layout patterns of patterned structures;

training, utilizing a first subset of the training data comprising physical design layout patterns containing hotspots, a first neural network model configured to generate synthetic physical design layout patterns;

training, utilizing a second subset of the training data comprising at least one physical design layout pattern containing a hotspot and at least one physical design layout pattern not containing a hotspot, a second neural network model configured to classify whether physical design layout patterns contain hotspots;

generating one or more synthetic physical design layout patterns containing hotspots, wherein generating the one or more synthetic physical design layout patterns containing hotspots comprises utilizing the trained first neural network model to generate a set of synthetic physical design layout patterns and utilizing the trained second neural network model to select one or more of the set of synthetic physical design layout patterns as the one or more synthetic physical design layout patterns containing hotspots; and evaluating manufacturability of a given patterned structure comprising at least one of the generated synthetic physical design layout patterns containing at least one hotspot.

20. The apparatus of claim 19, wherein a hotspot represents an area of a physical design layout pattern that at least one of: is not manufacturable; and renders at least a portion of a patterned structure comprising the hotspot inoperable.

* * * * *